United States Patent
Ikeda

(10) Patent No.: US 6,819,105 B2
(45) Date of Patent: Nov. 16, 2004

(54) SYSTEM AND METHODS FOR ENHANCING QUALITY OF IMAGES AFFECTED BY A MOTION OF A SUBJECT

(75) Inventor: Hitoshi Ikeda, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/318,788

(22) Filed: Dec. 13, 2002

(65) Prior Publication Data

US 2003/0117139 A1 Jun. 26, 2003

(30) Foreign Application Priority Data

Dec. 20, 2001 (JP) ........................................ 2001-386953

(51) Int. Cl.[7] .................................................. G01V 3/00
(52) U.S. Cl. ...................................................... 324/309
(58) Field of Search ................................. 324/307, 309

(56) References Cited

U.S. PATENT DOCUMENTS

| | | | |
|---|---|---|---|
| 5,406,947 A | * | 4/1995 | Kimura ........................ 600/410 |
| 5,572,124 A | * | 11/1996 | Bito et al. ................... 324/307 |
| 5,786,692 A | | 7/1998 | Maier et al. |
| 5,833,609 A | | 11/1998 | Dannels et al. |
| 6,066,950 A | | 5/2000 | Tsukamoto et al. |
| 6,320,378 B1 | | 11/2001 | Maier et al. |
| 6,433,547 B2 | * | 8/2002 | Kabasawa et al. ........... 324/314 |
| 6,528,996 B1 | * | 3/2003 | Sato ............................ 324/307 |

* cited by examiner

Primary Examiner—Diego Gutierrez
Assistant Examiner—Dixomara Vargas
(74) Attorney, Agent, or Firm—Carl B. Horton, Esq.; Armstrong Teasdale LLP

(57) ABSTRACT

For the purpose of suppressing degradation in visibility of an image by a missing line due to the subject motion, the step of selectively exciting a linear region with intersecting 90° and 180° pulses and applying an MPG pulse to collect data is repeated with the linear region shifted; whether the acquired data for each line is affected by the subject motion is detected; and if the data is affected by the subject motion, interpolated data is employed in place of the data.

26 Claims, 7 Drawing Sheets

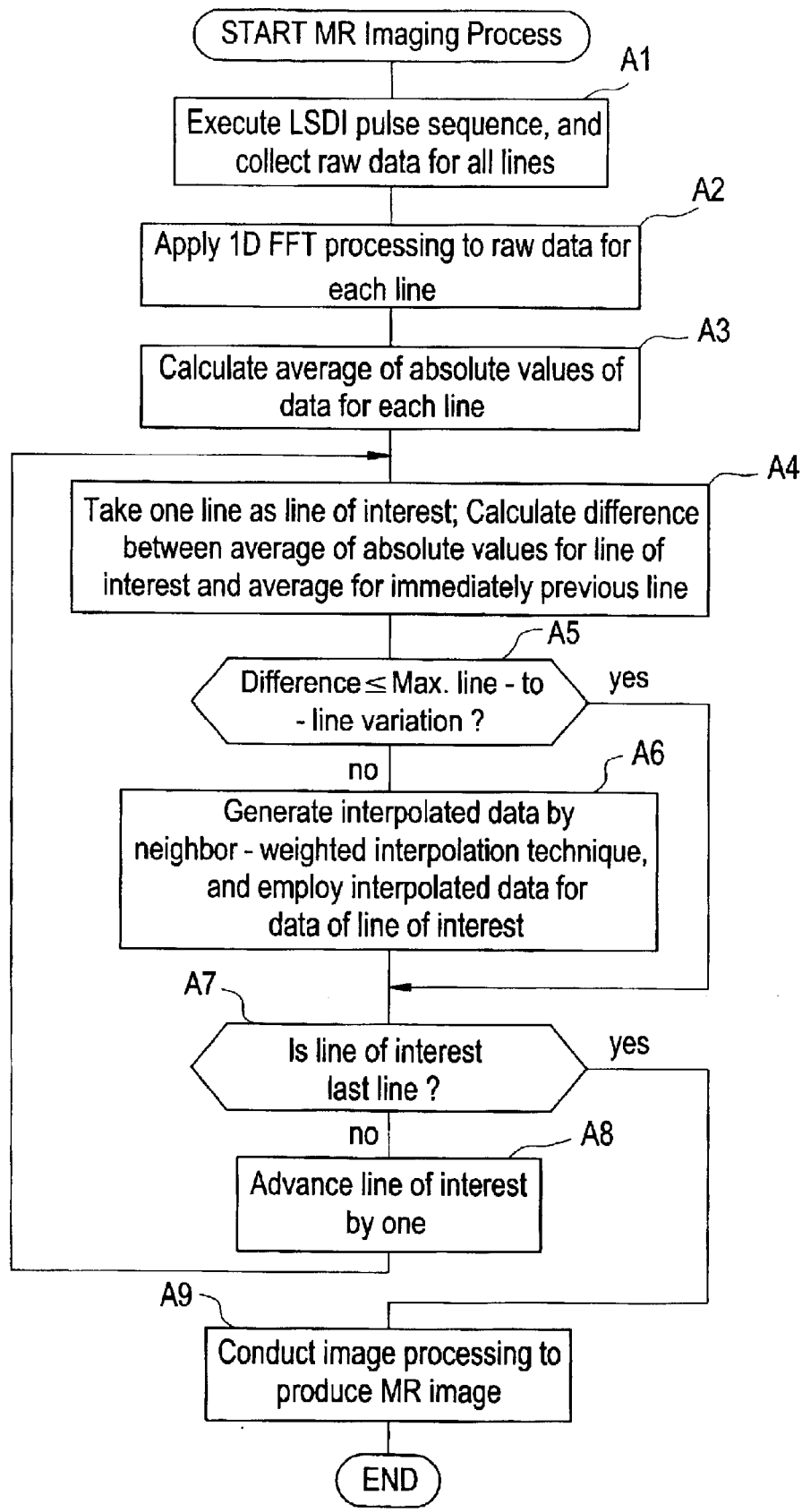

SYSTEM AND METHODS FOR ENHANCING QUALITY OF IMAGES AFFECTED BY A MOTION OF A SUBJECT

CROSS REFERENCE TO RELATED APPLICATIONS

This application claims the benefit of Japanese Application No. 2001-386953 filed Dec. 20, 2001.

BACKGROUND OF THE INVENTION

The present invention relates to an MR imaging method and an MRI (magnetic resonance imaging) apparatus, and more particularly to an MR imaging method and an MRI apparatus that can suppress degradation in visibility of an image by a missing line due to the subject motion.

In MRI, an LSDI (line scan diffusion imaging) technique is known as an example of DWI (diffusion weighted imaging) pulse sequences for imaging microscopic motion of water molecules, etc.

One example of the LSDI technique is disclosed in U.S. Pat. No. 5,786,692, for example.

In the LSDI technique, the step of selectively exciting a linear region and applying an MPG (motion probing gradient) pulse to collect data is repeated in a slice plane, and an MR image is reconstructed using the collected data.

FIG. 9 shows an example of an MR image obtained by the imaging according to the LSDI technique.

The MR image G1 exhibits a region of lesion $\alpha$ in white that has a diffusion altered by infarction etc. within an imaged site (e.g., brain tissue) B.

FIG. 10 shows an example of an MR image when the subject moved during the imaging according to the LSDI technique.

In the MR image G2, a so-called "missing line" F occurs, in which a portion of an image drops off to form a black line.

As described with reference to FIG. 10, if the subject moves during imaging, the missing line F occurs in an image, resulting in a problem of an image with degraded visibility.

SUMMARY OF THE INVENTION

It is therefore an object of the present invention is to provide an MR imaging method and an MRI apparatus that can suppress degradation in visibility of an image by a missing line due to the subject motion.

In accordance with a first aspect, the present invention provides an MR imaging method for reconstructing an MR image using a pulse sequence according to an LSDI technique in which the step of selectively exciting a linear region and applying an MPG pulse to collect data is repeated, said method characterized in comprising: detecting data affected by the subject motion; and re-imaging a region corresponding to said data.

In the MR imaging method of the first aspect, when a region corresponding to data affected by the subject motion is detected, the region is re-imaged; therefore, data with no (or reduced) effect of the subject motion can be collected. Thus, the number of missing lines is reduced, and an image with enhanced visibility can be displayed. This leads to no additional load to the subject because only a slight increase of imaging time is required for the re-imaging of a small region.

In accordance with a second aspect, the present invention provides the MR imaging method having the aforementioned configuration, characterized in that the re-imaging is terminated when the number of repetitions of the re-imaging becomes equal to or greater than a predetermined upper limit.

In the MR imaging method of the second aspect, since the number of repetitions of the re-imaging is limited, a disadvantage of endless re-imaging of the same region and reduction of imaging efficiency can be avoided.

In accordance with a third aspect, the present invention provides the MR imaging method having the aforementioned configuration, characterized in that the re-imaging is terminated when the re-imaging time becomes equal to or longer than a predetermined maximum time.

In the MR imaging method of the third aspect, since the re-imaging time is limited, a disadvantage of a too long re-imaging time can be avoided.

In accordance with a fourth aspect, the present invention provides an MR imaging method for reconstructing an MR image using a pulse sequence according to an LSDI technique in which the step of selectively exciting a linear region and applying an MPG pulse to collect data is repeated, said method characterized in comprising: detecting data affected by the subject motion; and employing interpolated data in place of said data.

In the MR imaging method of the fourth aspect, when data affected by the subject motion is detected, interpolated data is employed in place of the data; therefore, the number of missing lines can be reduced without lengthening the imaging time.

In accordance with a fifth aspect, the present invention provides the MR imaging method having the aforementioned configuration, characterized in that the interpolation is made using a neighbor-weighted interpolation technique.

In the MR imaging method of the fifth aspect, the neighbor-weighted interpolation technique provides interpolation with good accuracy.

In accordance with a sixth aspect, the present invention provides the MR imaging method having the aforementioned configuration, characterized in further comprising: defining beforehand a line range to be detected; and detecting data affected by the subject motion only in said line range.

In the MR imaging method of the sixth aspect, since the effect of the subject motion is detected for a limited line range (usually, a line range in the center of an image) that highly warrants prevention of the missing line, the apparent image quality can be improved while minimizing throughput decrease by the re-imaging.

In accordance with a seventh aspect, the present invention provides the MR imaging method having the aforementioned configuration, characterized in further comprising: determining beforehand a decision reference value for each site; and comparing the decision reference value corresponding to an imaged site with an evaluation value based on the collected data to detect data affected by the subject motion.

In the MR imaging method of the seventh aspect, since decision reference value is determined beforehand for each site, the detection of data affected by the subject motion can be achieved by a simple comparison calculation.

In accordance with an eighth aspect, the present invention provides the MR imaging method having the aforementioned configuration, characterized in further comprising: calculating a decision reference value based on the result of a prescan; and comparing said decision reference value with an evaluation value based on the collected data to detect data affected by the subject motion.

In the MR imaging method of the eighth aspect, since the decision reference value is calculated by a pre-scan, a decision reference value accommodating individual differences among subjects can be determined.

In accordance with a ninth aspect, the present invention provides the MR imaging method having the aforementioned configuration, characterized in further comprising: calculating a decision reference value based on the data being collected; and comparing said decision reference value with an evaluation value based on the collected data to detect data affected by the subject motion.

In the MR imaging method of the ninth aspect, since the decision reference value is calculated based on the data being collected, a decision reference value adapted to the actual imaging condition can be determined.

In accordance with a tenth aspect, the present invention provides the MR imaging method having the aforementioned configuration, characterized in that said evaluation value is the sum or average of absolute values of data for one line or a few lines.

In the MR imaging method of the tenth aspect, the fact that the sum or average of absolute values of data for a line with the subject motion is smaller than the sum or average of absolute values of data for a line without the subject motion is utilized to detect data affected by the subject motion.

In accordance with an eleventh aspect, the present invention provides the MR imaging method having the aforementioned configuration, characterized in that said evaluation value is the variance of absolute values of data for one line or a few lines.

In the MR imaging method of the eleventh aspect, the fact that the variance of absolute values of data for a line with the subject motion is smaller than the variance of absolute values of data for a line without the subject motion is utilized to detect data affected by the subject motion.

In accordance with a twelfth aspect, the present invention provides the MR imaging method having the aforementioned configuration, characterized in that said evaluation value is the variation of the sum or average of absolute values of data for one line or a few lines.

In the MR imaging method of the twelfth aspect, the fact that the difference between the sum or average of absolute values of data for a line with the subject motion and the sum or average of absolute values of data for a line without the subject motion is larger than the difference between the sums or averages of absolute values of data for lines without the subject motion is utilized to detect data affected by the subject motion.

In accordance with a thirteenth aspect, the present invention provides the MR imaging method having the aforementioned configuration, characterized in that said evaluation value is the variation of the variance of absolute values of data for one line or a few lines.

In the MR imaging method of the thirteenth aspect, the fact that the difference between the variance of absolute values of data for a line with the subject motion and the variance of absolute values of data for a line without the subject motion is larger than the difference between the variances of absolute values of data for lines without the subject motion is utilized to detect data affected by the subject motion.

In accordance with a fourteenth aspect, the present invention provides the MR imaging method having the aforementioned configuration, characterized in that said data is raw data before FFT (fast Fourier transformation) processing.

In the MR imaging method of the fourteenth aspect, since raw data before FFT processing is used to detect data affected by the subject motion, the necessity of re-imaging can be quickly determined.

In accordance with a fifteenth aspect, the present invention provides the MR imaging method having the aforementioned configuration, characterized in that said data is raw data subjected to FFT processing.

In the MR imaging method of the fifteenth aspect, since FFT-processed data that corresponds to an actual spatial position is used to detect data affected by the subject motion, alternatives such as use of data in the center of the line become available.

In accordance with a sixteenth aspect, the present invention provides an MRI apparatus characterized in comprising: RF (radio frequency) pulse transmitting means for transmitting an RF pulse; gradient magnetic field applying means for applying a gradient magnetic field; data collecting means for collecting data; pulse sequence control means for executing a pulse sequence according to an LSDI technique in which the step of selectively exciting a linear region and applying an MPG pulse to collect data is repeated; and re-imaging control means for detecting data affected by the subject motion, and re-imaging a region corresponding to said data.

In the MRI apparatus of the sixteenth aspect, the MR imaging method of the first aspect can be suitably implemented.

In accordance with a seventeenth aspect, the present invention provides an MRI apparatus characterized in comprising: RF pulse transmitting means for transmitting an RF pulse; gradient magnetic field applying means for applying a gradient magnetic field; data collecting means for collecting data; pulse sequence control means for executing a pulse sequence according to an LSDI technique in which the step of selectively exciting a linear region and applying an MPG pulse to collect data is repeated; and data interpolating means for detecting data affected by the subject motion, and employing interpolated data in place of said data.

In the MRI apparatus of the seventeenth aspect, the MR imaging method of the fourth aspect can be suitably implemented.

According to the MR imaging method and MRI apparatus of the present invention, an image of high quality can be produced with a reduced number of missing lines by re-imaging a region corresponding to data affected by the subject motion, thus providing ease of diagnosis. Moreover, since interpolated data is employed in place of data affected by the subject motion, the number of missing lines can be reduced without lengthening the imaging time.

Further objects and advantages of the present invention will be apparent from the following description of the preferred embodiments of the invention as illustrated in the accompanying drawings.

BRIEF DESCRIPTION OF THE DRAWINGS

FIG. 7 is a flow chart showing MR imaging processing in accordance with a second embodiment.

DETAILED DESCRIPTION OF THE INVENTION

The present invention will now be described in detail with reference to embodiments shown in the accompanying drawings.

First Embodiment

Figure 1:
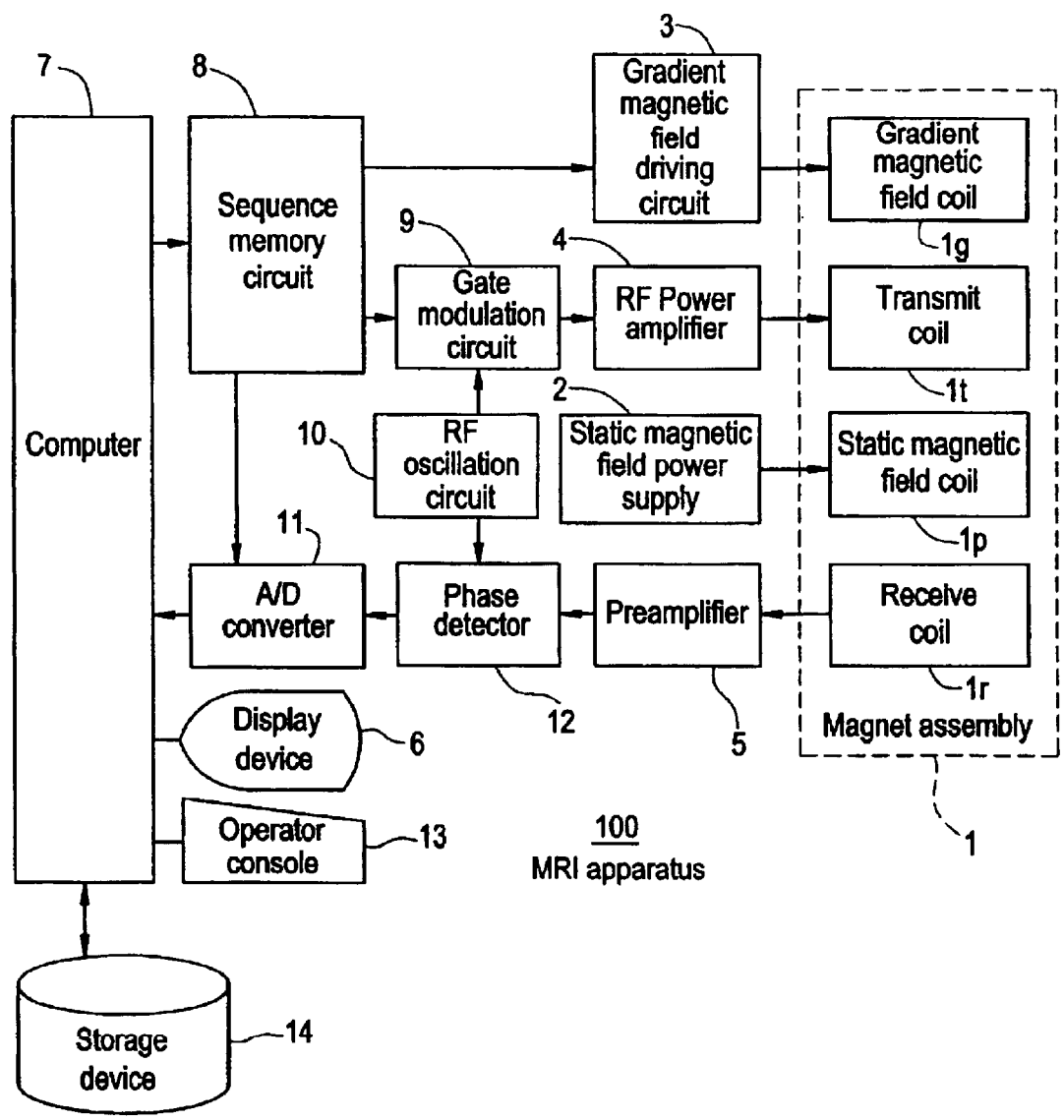
FIG. 1 is a prior art block diagram of an MRI apparatus.

FIG. 1 is a prior art block diagram of an MRI apparatus.

In the MRI apparatus 100, a magnet assembly 1 has a cavity portion (bore) for inserting therein a subject, and is provided with a static magnetic field coil 1p for applying a constant static magnetic field to the subject, a gradient magnetic field coil 1g for generating gradient magnetic fields (the gradient magnetic field coil is comprised of x-axis, y-axis and z-axis coils, and a slice axis, a read axis and a phase encoding axis are defined by the combination of the coils), a transmit coil 1t for transmitting RF pulses for exciting spins of atomic nuclei within the subject, and a receive coil 1r for receiving echo signals from the subject, these components being disposed surrounding the cavity portion. The static magnetic field coil 1p, gradient magnetic field coil 1g, transmit coil 1t, and receive coil 1r are connected to a static magnetic field power supply 2, a gradient magnetic field driving circuit 3, an RF power amplifier 4, and a preamplifier 5, respectively. A permanent magnet may be employed in place of the static magnetic field coil 1p and static magnetic field power supply 2.

A computer 7 creates a pulse sequence, and passes it to a sequence memory circuit 8. The sequence memory circuit 8 stores the pulse sequence, and operates the gradient magnetic field driving circuit 3 based on the stored pulse sequence to thereby generate gradient magnetic fields from the gradient magnetic field coil 1g in the magnet assembly 1. The sequence memory circuit 8 also operates a gate modulation circuit 9 to modulate a carrier output signal from an RF oscillation circuit 10 into a pulsed signal of predefined timing and envelope shape. The pulsed signal is applied to the RF power amplifier 4 as an RF pulse, power-amplified in the RF power amplifier 4, and then applied to the transmit coil 1t in the magnet assembly 1.

The preamplifier 5 amplifies an echo signal received at the receive coil 1r in the magnet assembly 1, and inputs the signal to a phase detector 12. The phase detector 12 phase-detects the echo signal employing the carrier output signal from the RF oscillation circuit 10 as a reference signal, and supplies the phase-detected signal to an A/D converter 11. The A/D converter 11 converts the analog echo signal into digital signal, and inputs it to the computer 7.

The computer 7 reads the digitized echo signal from the A/D converter 11, and stores it in a storage device 14 as raw data. The computer 7 also performs FFT processing on the raw data, and stores the FFT-processed data in the storage device 14. The computer 7 further performs image processing on the FFT-processed data to produce MR image.

A display device 6 displays the MR image.

Moreover, the computer 7 is responsible for overall control such as receiving information supplied from an operator console 13.

Figure 2:
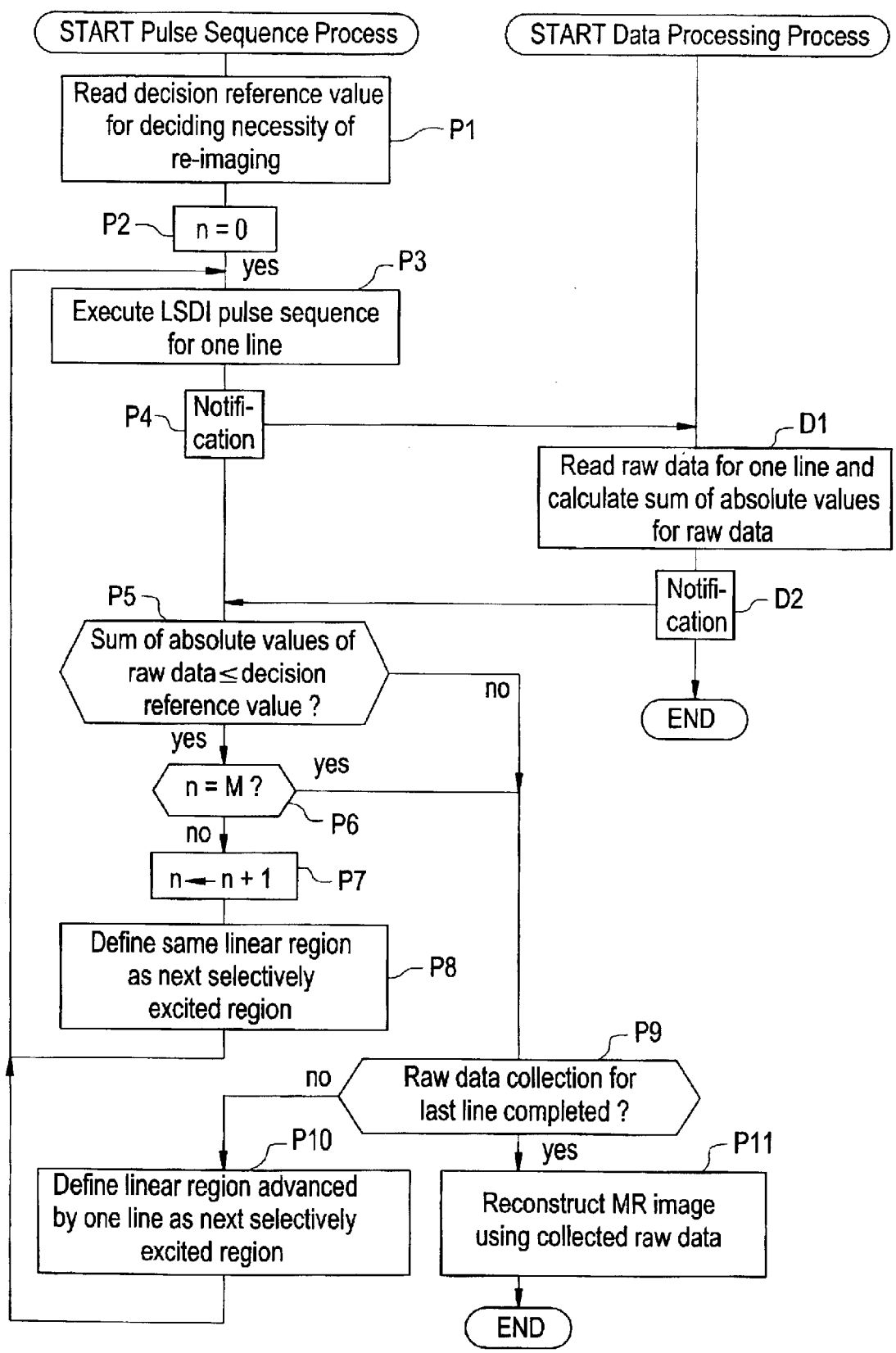
FIG. 2 is a flow chart showing MR imaging processing by the MRI apparatus of FIG. 1.

FIG. 2 is a flow chart showing MR imaging processing executed by the MRI apparatus 100. The left flow is for a pulse sequence process for executing a pulse sequence; and the right flow is for a data processing process for processing raw data.

In Step P1, the pulse sequence process reads a decision reference value for determining the necessity of re-imaging. Specifically, it reads a decision reference value corresponding to an imaged site among decision reference values predetermined for every imaged site.

In Step P2, the pulse sequence process initializes the number of repetitions of re-imaging n to zero.

Figure 3:
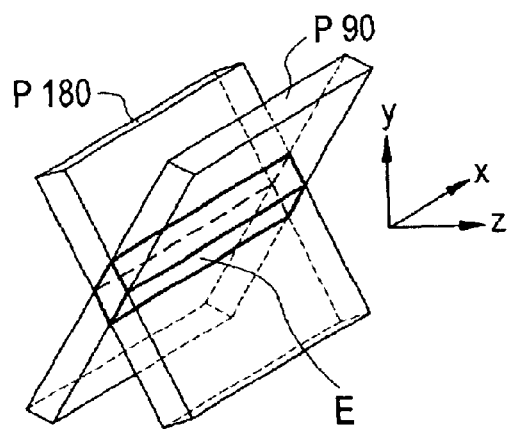
FIG. 3 is an explanatory diagram showing the imaging principle of an LSDI technique.

In Step P3, the pulse sequence process executes a pulse sequence according to the LSDI technique for one line involving selectively exciting a linear region E at which an excited region P90 by a 90° pulse and an inverted region P180 by a 180° pulse intersect, as shown in FIG. 3, and applying an MPG pulse to collect raw data, and stores the raw data in the storage device 14.

Figure 4:
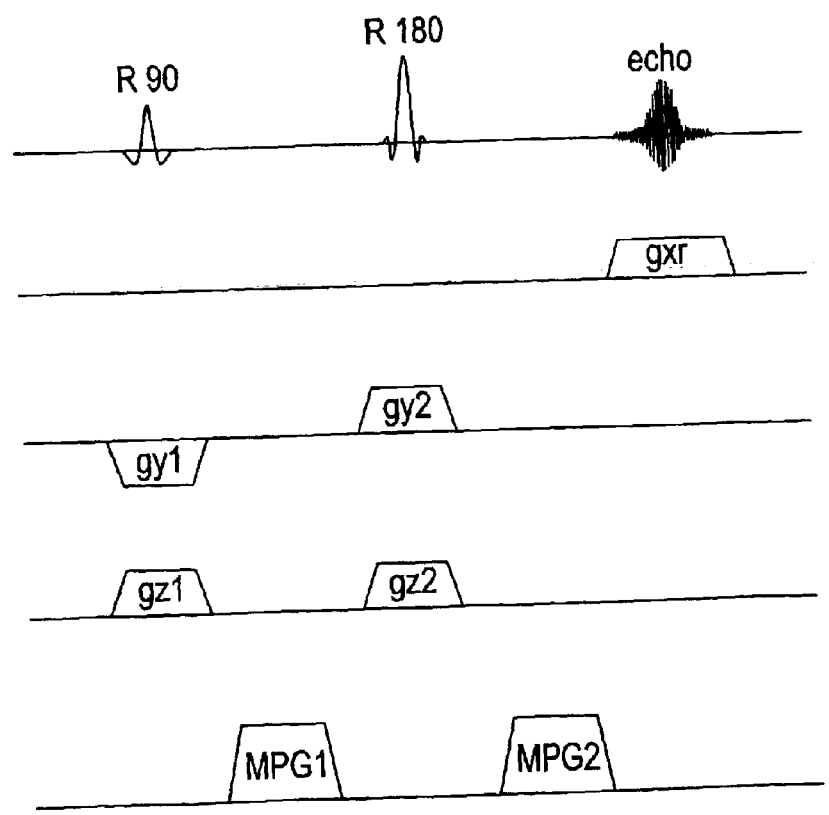
FIG. 4 is a pulse sequence chart showing an exemplary pulse sequence according to the LSDI technique.

FIG. 4 is a pulse sequence chart showing an example of the pulse sequence according to the LSDI technique.

The pulse sequence transmits a 90° pulse R90 and at the same time applies slice gradients gy1 and gz1 to the y-axis and z-axis gradient magnetic field coils 1g to excite the excited region P90 by the 90° pulse. Next, an MPG pulse MPG1 is applied. Then, the pulse sequence transmits a 180° pulse R180 and at the same time applies slice gradients gy2 and gz2 to the y-axis and z-axis gradient magnetic field coils 1g to inversely excite the inverted region P180 by the 180° pulse, which region intersects the excited region P90 by the 90° pulse. Then, an MPG pulse MPG2 is applied. Subsequently, raw data is collected based on an echo signal "echo" generated by selectively exciting the linear region E at which the excited region P90 by the 90° pulse and the inverted region P180 by the 180° pulse intersect, while applying a read pulse gxr to the x-axis gradient magnetic field coil 1g.

Returning to FIG. 2, in Step P4, the pulse sequence process informs the data processing process of completion of storage of the raw data for one line.

In Step D1, the data processing process reads the data for one line from the storage device 14, and calculates the sum of absolute values of the data.

In Step D2, the data processing process transmits the sum of absolute values to the pulse sequence process.

In Step P5, considering the fact that the sum of absolute values of raw data for a line with the subject motion is smaller than the sum of absolute values of raw data for a line without the subject motion, if the sum of absolute values of the raw data is equal to or less than the decision reference value, the process goes to Step P6 under the determination that the data is affected by the subject motion; otherwise, to Step P9 under the determination that the data is unaffected by the subject motion.

In Step P6, if the number of repetitions of re-imaging n reaches an upper limit M, the process goes to Step P9; otherwise, to Step P7. The upper limit of re-imaging M is predefined at the factory or by an operator.

In Step P7, the number of repetitions of re-imaging n is incremented by one.

In Step P8, the same linear region is defined as a next selectively excited region. Thereafter, the process goes back to Step P3. Thus, the same linear region is re-imaged.

In Step P9, the pulse sequence process goes to Step P10 if raw data for the last line has not been collected; or goes to Step P11 if raw data for the last line has been collected.

Figure 5:
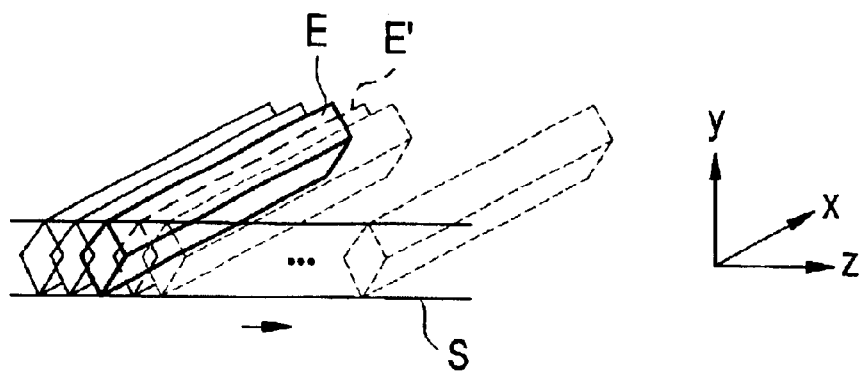
FIG. 5 is an explanatory diagram showing that a linear region is shifted in a view direction in a slice plane.

In Step P10, a linear region E' advanced by one line is defined as the next selectively excited region, as shown in FIG. 5, and the process goes back to Step P3.

In Step P11, an MR image is reconstructed using the collected raw data.

Figure 6:
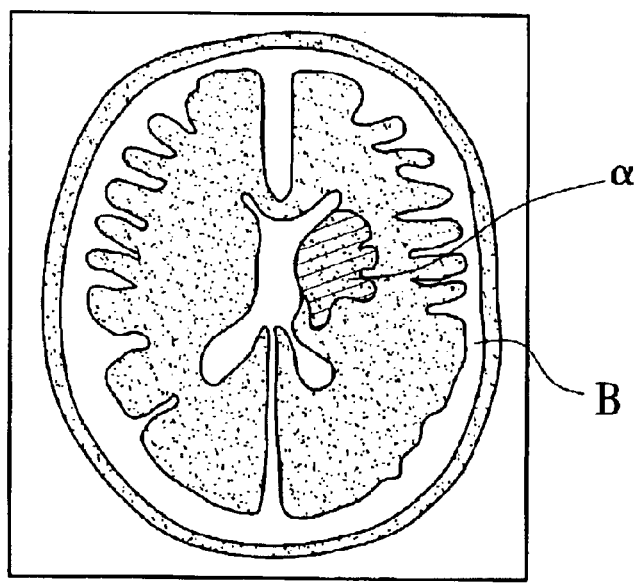
FIG. 6 is a schematic diagram showing an MR image displayed by the MRI apparatus of FIG. 1.

The MR image G1 is exemplarily shown in FIG. 6. Since a linear region affected by the subject motion is re-imaged, an image with enhanced visibility is provided having no missing line.

According to the MRI apparatus 100 as described above, since a line affected by the subject motion is re-imaged, the number of missing lines in an MR image is reduced, and an image with enhanced visibility is displayed.

The configuration of the first embodiment may be altered as follows:

(1) Although the re-imaging of a line of interest is forcibly terminated triggered by n=M, the re-imaging of the line of interest may be forcibly terminated triggered by the re-imaging time reaching a predetermined maximum time. In this case, the upper limit of the time required for imaging can be specified more accurately.

(2) The effect of the subject motion may be detected only in a predefined line range. For example, if the effect of the subject motion is detected in a limited line range corresponding to the center of a screen, the reduction in throughput by re-imaging of a region corresponding to a portion near the periphery of the screen that is less clinically valuable can be prevented.

(3) The decision reference value may be calculated based on raw data collected by a pre-scan that is conducted for adjusting several parts of the apparatus. In this case, a decision reference value can be more accurately determined that accommodates individual differences among subjects.

(4) The decision reference value may be continuously updated by processing raw data being collected in real time. For example, if the decision reference value is calculated based on the moving average of raw data, the decision reference value can reflect the natural change in the raw data in the proximity of the line of interest.

(5) In the comparison with the decision reference value (Step P5 in FIG. 2), the average of absolute values of echo signals may be employed in place of the sum of absolute values of echo signals. Alternatively, considering the fact that the variance of absolute values of data for a line decreases when a missing line is present, the variance of absolute values of echo signals may be employed.

(6) Instead of the pulse sequence process, the data processing process may obtain the decision reference value to detect data affected by the subject motion.

(7) The detection of data affected by the subject motion and re-imaging may be conducted for a set of lines (e.g. two—five lines) as a unit.

Second Embodiment

FIG. 7 is a flow chart showing MR imaging processing in accordance with a second embodiment of the present invention.

In Step A1, a pulse sequence according to the LSDI technique is executed to collect raw data for all lines.

In Step A2, one-dimensional FFT processing is applied to the raw data for each line.

In next Step A3, the average of absolute values of the data subjected to the one-dimensional FFT processing is calculated for each line.

In Step A4, one line is taken as a line of interest, and the difference between the average of absolute values for the line of interest and the average of absolute values for an immediately previous line is calculated.

In Step A5, if the difference is greater than a predetermined maximum line-to-line variation, decision that a missing line has occurred is made and the process goes to Step A6. If the difference is not greater than the predetermined maximum line-to-line variation, decision that no missing line has occurred is made and the process goes to Step A7.

Figure 8A:
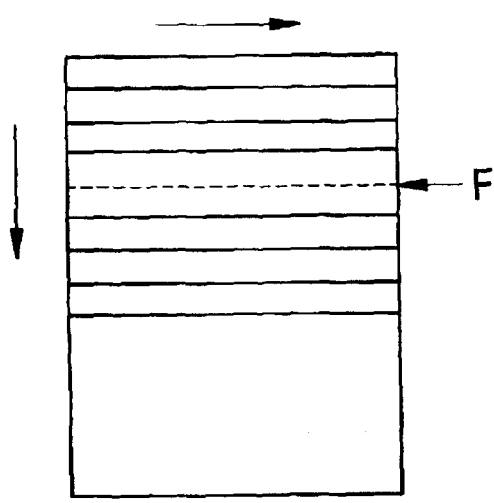
FIG. 8 is an explanatory diagram showing the principle of interpolation of line data.
Figure 8B:
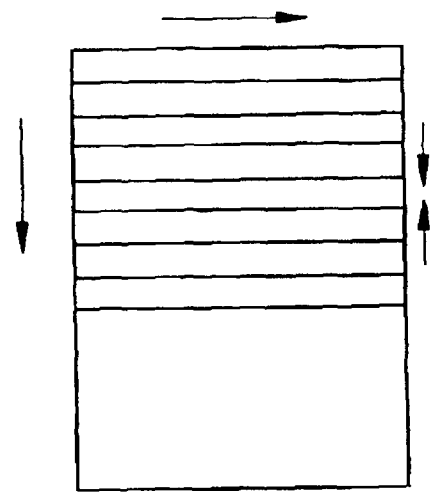
Figure 9:
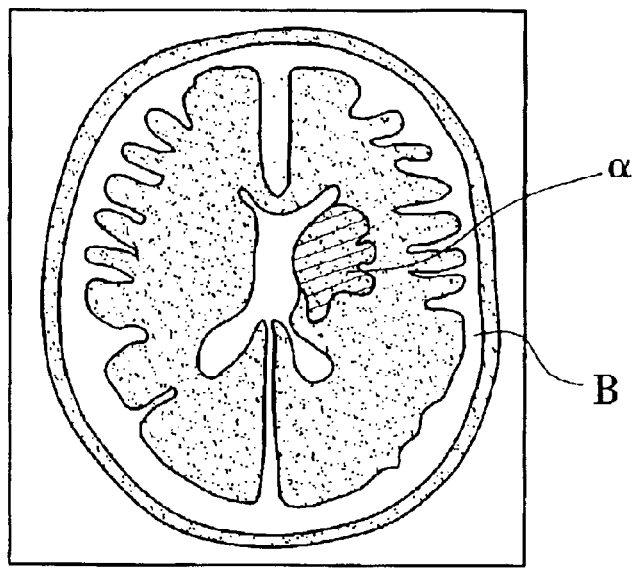
FIG. 9 is a schematic diagram showing an exemplary MR image obtained by imaging according to the LSDI technique.
Figure 10:
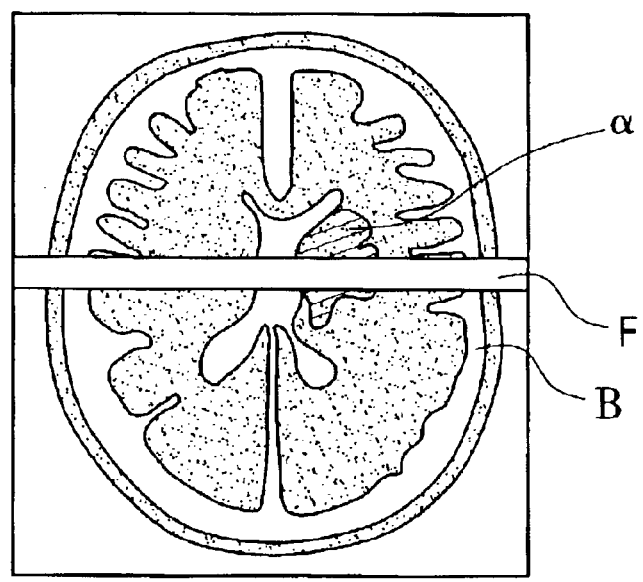
FIG. 10 is a schematic diagram showing an exemplary MR image with a missing line.

In Step A6, interpolated data is generated from data for lines near the line that is decided to be a missing line F using a neighbor-weighted interpolation technique, as shown in FIGS. 8(a) and (b), and the interpolated data is used for the line that is decided to be the missing line F.

In Step A7, if the line of interest is not the last line, the process goes to Step A8; otherwise, to Step A9.

In Step A8, the line of interest is advanced by one. Then, the process goes back to Step A4.

Step A9, an MR image is produced.

Although the interpolated data is generated by the neighbor-weighted interpolation technique in this flow, the data may be generated by some other interpolation technique.

According to the MR imaging processing of the second embodiment, since interpolated data is employed in place of data affected by the subject motion, the number of missing lines is reduced and the apparent image quality is improved without lengthening the imaging time.

Although raw data is processed in the first embodiment, the data to be processed may be obtained by applying FFT processing.

Moreover, although data obtained by applying FFT processing to raw data is processed in the second embodiment, the data to be processed may be raw data before FFT processing.

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method for reconstructing an MR image using a pulse sequence according to an LSDI technique in which the step of selectively exciting a linear region and applying an MPG pulse is repeated, said method comprising:

collecting data obtained by scanning a subject using said pulse sequence;

determining whether the collected data is affected by a motion of the subject; and re-imaging a region corresponding to said collected data if the collected data is affected by the subject motion.

2. The MR imaging method of claim 1, wherein the re-imaging is terminated when a number of repetitions of the re-imaging becomes equal to or greater than a predetermined upper limit.

3. The MR imaging method of claim 1, wherein the re-imaging is terminated when a time for performing the re-imaging becomes equal to or longer than a predetermined maximum time.

4. The MR imaging method of claim 1, wherein further comprising: calculating a decision reference value based on the result of a prescan; and comparing said decision reference value with an evaluation value based on the collected data to detect data affected by the subject motion.

5. The MR imaging method of claim 1, wherein further comprising: calculating a decision reference value based on the collected data; and comparing said decision reference value with an evaluation value based on the collected data to detect data affected by the subject motion.

6. The MR imaging method of claim 1, wherein said collected data is raw data before FFT processing.

7. The MR imaging method of claim 1, wherein said collected data is data generated after being subjected to FFT processing.

8. An MR imaging method for reconstructing an MR image using a pulse sequence according to an LSDI technique in which the step of selectively exciting a linear region and applying an MPG pulse is repeated, said method comprising:

collecting data obtained by scanning a subject using said pulse sequence;

determining whether the collected data is affected by a motion of the subject; and interpolating the collected data with interpolated data if the collected data is affected by the subject motion.

9. The MR imaging method of claim 8, wherein the interpolating comprises using a neighbor-weighted interpolation technique.

10. The MR imaging method of claim 8, wherein further comprising: calculating a decision reference value based on the result of a prescan; and comparing said decision reference value with an evaluation value based on the collected data to detect data affected by the subject motion.

11. The MR imaging method of claim 8, wherein further comprising: calculating a decision reference value based on the collected data; and comparing said decision reference value with an evaluation value based on the collected data to detect data affected by the subject motion.

12. The MR imaging method of claim 8, wherein said collected data is raw data before FFT processing.

13. The MR imaging method of claim 8, wherein said collected data is data generated after being subjected to FFT processing.

14. An MR imaging method for reconstructing an MR image using a pulse sequence according to an LSDI technique in which the step of selectively exciting a linear region and applying an MPG pulse to collect data is repeated, said method comprising:

defining beforehand a line range to be detected using said pulse sequence;

detecting data affected by a motion of a subject only in said line range; and re-imaging a region corresponding to said data.

15. An MR imaging method for reconstructing an MR image using a pulse sequence according to an LSDI technique in which the step of selectively exciting a linear region and applying an MPG pulse to collect data is repeated, said method comprising:

determining beforehand a decision reference value;

comparing said decision reference value with an evaluation value based on the collected data using said pulse sequence to detect whether the collected data is affected by a motion of a subject;

detecting whether the collected data is affected by the subject motion; and re-imaging a region corresponding to said collected data.

16. The MR imaging method of claim 15, wherein said evaluation value is a sum or average of absolute values of data for at least one line.

17. The MR imaging method of claim 15, wherein said evaluation value is a variance of absolute values of data for at least one line.

18. The MR imaging method of claim 15, wherein said evaluation value is a variation of a sum or average of absolute values of data for at least one line.

19. The MR imaging method of claim 15, wherein said evaluation value is a variation of a variance of absolute values of data for at least one line.

20. An MRI apparatus comprising:

RF pulse transmitting means for transmitting an RF pulse;

gradient magnetic field applying means for applying a gradient magnetic field;

data collecting means for collecting data;

pulse sequence control means for executing a pulse sequence according to an LSDI technique in which the step of selectively exciting a linear region and applying an MPG pulse to collect data is repeated; and re-imaging control means for:

determining whether the collected data is affected by a motion of the subject; and re-imaging a region corresponding to said collected data if the collected data is affected by the subject motion.

21. An MR imaging method for reconstructing an MR image using a pulse sequence according to an LSDI technique in which the step of selectively exciting a linear region and applying an MPG pulse to collect data is repeated, said method comprising:

defining beforehand a line range to be detected using said pulse sequence;

detecting data affected by a motion of a subject only in said line range; and employing interpolated data in place of said data.

22. An MR imaging method for reconstructing an MR image using a pulse sequence according to an LSDI technique in which the step of selectively exciting a linear region and applying an MPG pulse to collect data is repeated, said method comprising:

determining beforehand a decision reference value;

comparing said decision reference value with an evaluation value based on the collected data using said pulse sequence to detect whether the collected data is affected by a motion of a subject;

detecting whether the collected data is affected by the subject motion; and employing interpolated data in place of said collected data.

23. The MR imaging method of claim 22, wherein said evaluation value is a sum or average of absolute values of data for at least one line.

24. The MR imaging method of claim 22, wherein said evaluation value is a variance of absolute values of data for at least one line.

25. The MR imaging method of claim 22, wherein said evaluation value is a variation of a sum or average of absolute values of data for at least one line.

26. The MR imaging method of claim 22, wherein said evaluation value is a variation of a variance of absolute values of data for at least one line.

* * * * *